(12) United States Patent
Morita

(10) Patent No.: US 10,416,823 B2
(45) Date of Patent: Sep. 17, 2019

(54) CAPACITIVE TOUCH SWITCH APPARATUS

(71) Applicant: DENSO WAVE INCORPORATED, Chita-gun, Aichi-Pref. (JP)

(72) Inventor: Yuya Morita, Chita-gun (JP)

(73) Assignee: DENSO WAVE INCORPORATED, Aichi-Pref. (JP)

( * ) Notice: Subject to any disclaimer, the term of this patent is extended or adjusted under 35 U.S.C. 154(b) by 5 days.

(21) Appl. No.: 15/726,893

(22) Filed: Oct. 6, 2017

(65) Prior Publication Data

US 2018/0101260 A1    Apr. 12, 2018

(30) Foreign Application Priority Data

Oct. 12, 2016  (JP) .................................. 2016-200625

(51) Int. Cl.
| | | |
|---|---|---|
| *G06F 3/044* | (2006.01) | |
| *G02F 1/1333* | (2006.01) | |
| *G02F 1/1343* | (2006.01) | |
| *G06F 3/041* | (2006.01) | |
| *H03K 17/96* | (2006.01) | |
| *G06F 3/0484* | (2013.01) | |

(52) U.S. Cl.
CPC ............ *G06F 3/044* (2013.01); *G02F 1/1343* (2013.01); *G02F 1/13338* (2013.01); *G06F 3/0412* (2013.01); *H03K 17/962* (2013.01); *G06F 3/04847* (2013.01); *H03K 2217/94026* (2013.01); *H03K 2217/960705* (2013.01); *H03K 2217/960755* (2013.01)

(58) Field of Classification Search
CPC ....................................................... G06F 3/044
See application file for complete search history.

(56) References Cited

U.S. PATENT DOCUMENTS

| | | | | |
|---|---|---|---|---|
| 2012/0105367 A1* | 5/2012 | Son | ....................... | G06F 3/0414 |
| | | | | 345/174 |
| 2012/0146940 A1* | 6/2012 | Yamamoto | ............ | G06F 3/0416 |
| | | | | 345/174 |
| 2013/0002579 A1* | 1/2013 | Hatano | ................. | G06F 3/0418 |
| | | | | 345/173 |

FOREIGN PATENT DOCUMENTS

JP          2012-79661 A        4/2012

* cited by examiner

*Primary Examiner* — Hang Lin
(74) *Attorney, Agent, or Firm* — Oliff PLC

(57) ABSTRACT

A capacitive touch switch apparatus includes a touch electrode; a touch detection circuit that generates a capacitance signal indicative of a capacitance of the touch electrode in accordance with a touch to the touch electrode, and generates and outputs a touch detection signal indicative of presence or absence of the touch by comparing the capacitance signal with a predetermined threshold; and a threshold determination circuit that supplies a threshold determination signal for determining the threshold to the touch detection circuit. The threshold determination circuit supplies the threshold determination signal to the touch detection circuit so as to increase the threshold in accordance with a change of the touch detection signal from a first level indicative of absence of the touch to a second level indicative of presence of the touch.

9 Claims, 9 Drawing Sheets

CAPACITIVE TOUCH SWITCH APPARATUS

CROSS REFERENCE TO RELATED APPLICATION

The present application is based on Japanese Patent Application No. 2016-200625 filed on Oct. 12, 2016, the disclosure of which is incorporated herein by reference.

TECHNICAL FIELD

The present disclosure relates to a capacitive touch switch apparatus equipped in controllers or the like of air conditioners.

BACKGROUND

Patent Literature 1: JP 2012-79661 A

Patent Literature 1 discloses a capacitive touch switch apparatus. This touch switch device includes a touch detecting electrode (touch electrode) whose capacitance changes when an operator performs a touch operation, and a detecting unit that detects changes in the capacitance based on the touch operation by applying an AC voltage to the touch detecting electrode. The touch detecting electrode is made of copper foil and formed as a circular pattern on a circuit substrate. The detecting unit detects presence or absence of a touch operation by detecting a change in the capacitance.

SUMMARY

It is an object of the present disclosure to provide a capacitive touch switch apparatus.

According to one aspect of the present disclosure, a capacitive touch switch apparatus includes: a touch electrode; a touch detection circuit that generates a capacitance signal indicative of a capacitance of the touch electrode in accordance with a touch to the touch electrode, and generates and outputs a touch detection signal indicative of presence or absence of the touch by comparing the capacitance signal with a predetermined threshold; and a threshold determination circuit that supplies a threshold determination signal for determining the threshold to the touch detection circuit. The threshold determination circuit supplies the threshold determination signal to the touch detection circuit so as to increase the threshold in accordance with a change of the touch detection signal from a first level indicative of absence of the touch to a second level indicative of presence of the touch.

According to the capacitive touch switch apparatus, the threshold is increased in accordance with a change of the touch detection signal from a first level indicative of the absence of a touch to a second level indicative of the presence of a touch. It may be possible to increase the response speed of the touch electrode in the transition from a touch state to a non-touch state without changing the response speed of the touch electrode in the transition from the non-touch state to the touch state in a touch operation.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 11A:
FIG. 11A is a diagram illustrating a related square touch electrode.
Figure 11B:
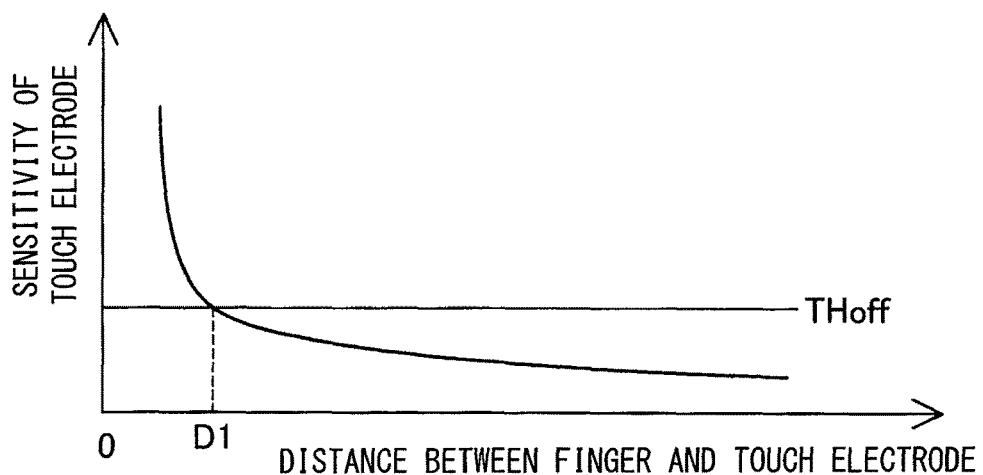
FIG. 11B is a diagram illustrating changes in the sensitivity of the related square touch electrode.

The inventor of the present application has found the followings. A touch electrode used in a related art has a shape that is vertically and horizontally substantially symmetrical, such as circle and square. FIG. 11A and FIG. 11B are diagrams that illustrate changes in the sensitivity of a square touch electrode 601 in the related art as a finger that is in contact with the touch electrode moves away. The "sensitivity" as used herein refers to response intensity of the touch electrode in response to the movement of the operator's finger. The "response intensity of the touch electrode" corresponds to the voltage value of a signal indicative of the capacitance of the touch electrode. An OFF threshold THoff is an upper limit value at which it is determined that no touch operation is being performed to the touch electrode. As shown in FIG. 11A and FIG. 11B, when the operator's finger moves away from the touch electrode 601 after touching the center of the touch electrode 601, the sensitivity of the touch electrode 601 falls rapidly. After the distance between the finger and the touch electrode exceeds D1, it is determined that no touch operation is being performed to the touch electrode 601.

Figure 12A:
FIG. 12A is a diagram illustrating another related rectangular touch electrode.
Figure 12B:
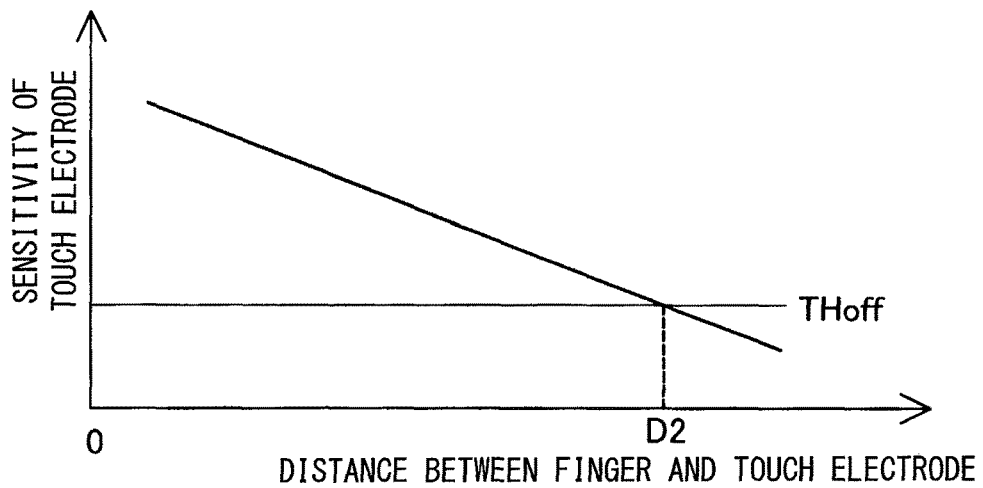
FIG. 12B is a diagram illustrating changes in the sensitivity of another related rectangular touch electrode.

On the other hand, FIG. 12A and FIG. 12B are diagrams that illustrate changes in the sensitivity of a rectangular touch electrode 602. As the operator's finger moves away from the touch electrode 602, the sensitivity of the touch electrode 602 falls slowly as compared to FIG. 11A and FIG. 11B. Therefore, it is determined that the touch operation is being performed to the touch electrode 602 until immediately before the distance between the finger and the touch electrode reaches D2 which is larger than distance D1 (see FIG. 11B). Thus, when the touch electrode is rectangular, the operator experiences an unpleasant feeling that the response is slow when the operator takes off the finger from the touch electrode. That is, touch is detected for a certain period of time even after the operator's finger has separated from the touch electrode. This period is long enough for the operator to perceive the difference between the operator's own image of operation (touch stopped) and the operation being actually performed by the touch electrode (touch continued). This phenomenon is highly likely observed with other touch electrodes that have other shapes extending in the longitudinal direction or irregular-shaped touch electrodes other than rectangular touch electrodes.

When incorporating touch electrodes in an actual product, touch electrodes with shapes extending in the longitudinal direction or irregular shapes may be desirable, for example, in order to make them conform to the shape of the controller of an air conditioner. Accordingly, techniques that increase the response speed in the transition from a touch state to a non-touch state for capacitive touch switch apparatus that use touch electrodes with such shapes may be desired.

(First Embodiment)

Figure 1:
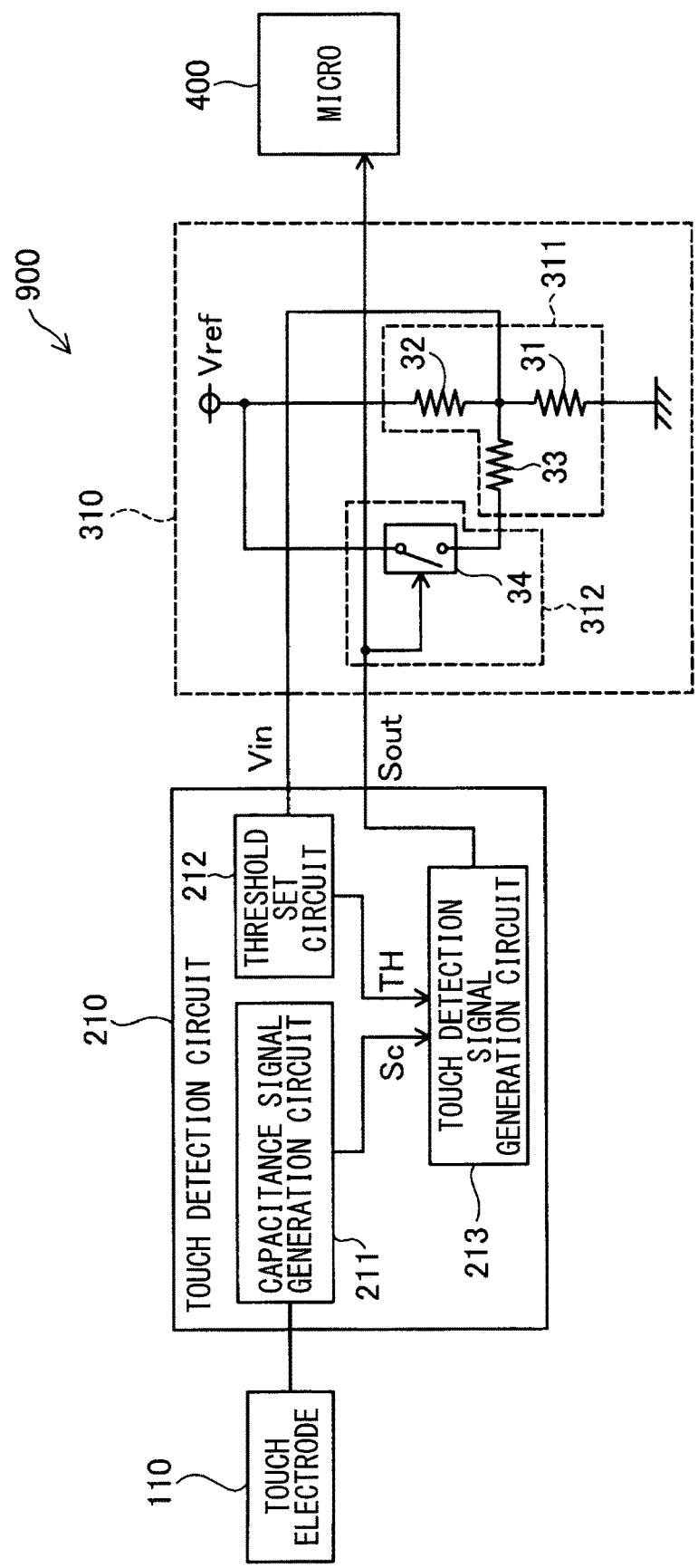
FIG. 1 is a diagram showing a system configuration of a capacitive touch switch apparatus in a first embodiment of the present disclosure.

FIG. 1 is an illustrative diagram showing a system configuration of a capacitive touch switch apparatus 900 in a first embodiment of the present disclosure. The capacitive touch switch apparatus 900 is used for a controller of an air conditioner, for example. The capacitive touch switch apparatus 900 includes a touch electrode 110, a touch detection circuit 210, a threshold determination circuit 310, and a microcomputer 400.

The touch detection circuit 210 includes a capacitance signal generation circuit 211, a threshold set circuit 212, and a touch detection signal generation circuit 213. The capacitance signal generation circuit 211 is connected to the touch electrode 110, and generates a capacitance signal Sc indicative of the capacitance of the touch electrode 110 in accordance with a touch operation. The threshold set circuit 212 sets a threshold TH for the touch detection circuit 210. The threshold TH can be expressed by, for example, Equation 1:

$$TH = TH0 \times \alpha \qquad \text{Equation 1}$$

wherein TH0 represents a predetermined fixed value, and α represents a threshold coefficient.

The touch detection signal generation circuit 213 compares the capacitance signal Sc generated by the capacitance signal generation circuit 211 with the threshold TH, so as to generate a touch detection signal Sout indicative of the presence or absence of a touch and outputs the signal to the microcomputer 400.

The threshold determination circuit 310 is connected to the touch detection circuit 210, and supplies a threshold determination signal Vin for determining the threshold TH of the touch detection circuit 210 to the touch detection circuit 210. The threshold determination circuit 310 includes a voltage divider circuit 311 including resistors 31, 32, and 33, and a switching circuit 312 including a field effect transistor (FET) 34 (hereinafter referred to as FET 34). The resistors 31 and 32 of the voltage divider circuit 311 are connected in series between a ground electrode having a ground potential and a power supply terminal that outputs a reference voltage Vref. The resistor 33 and FET 34 are connected in series further between a connection terminal between the two resistors 31 and 32 and the power supply terminal that outputs the reference voltage Vref. A touch detection signal Sout is input to a gate terminal of the FET 34.

The voltage divider circuit 311 divides the reference voltage Vref with the resistors 31, 32, and 33 to generate a threshold determination signal Vin, and inputs the signal to the threshold set circuit 212 of the touch detection circuit 210. The switching circuit 312 changes the division ratio of the voltage divider circuit 311 in accordance with the touch detection signal Sout output from the touch detection signal generation circuit 213 of the touch detection circuit 210, to change the voltage of the threshold determination signal Vin. More specifically, the FET 34 is turned on and off in accordance with the touch detection signal Sout, whereby the division ratio of the reference voltage Vref divided by the voltage divider circuit 311 is changed.

The microcomputer 400 includes a central processing unit and a main storage device. The microcomputer 400 determines the presence or absence of a touch operation by an operator to the touch electrode 110 based on the touch detection signal Sout indicative of the presence or absence of a touch input from the touch detection signal generation circuit 213 of the touch detection circuit 210.

Figure 2:
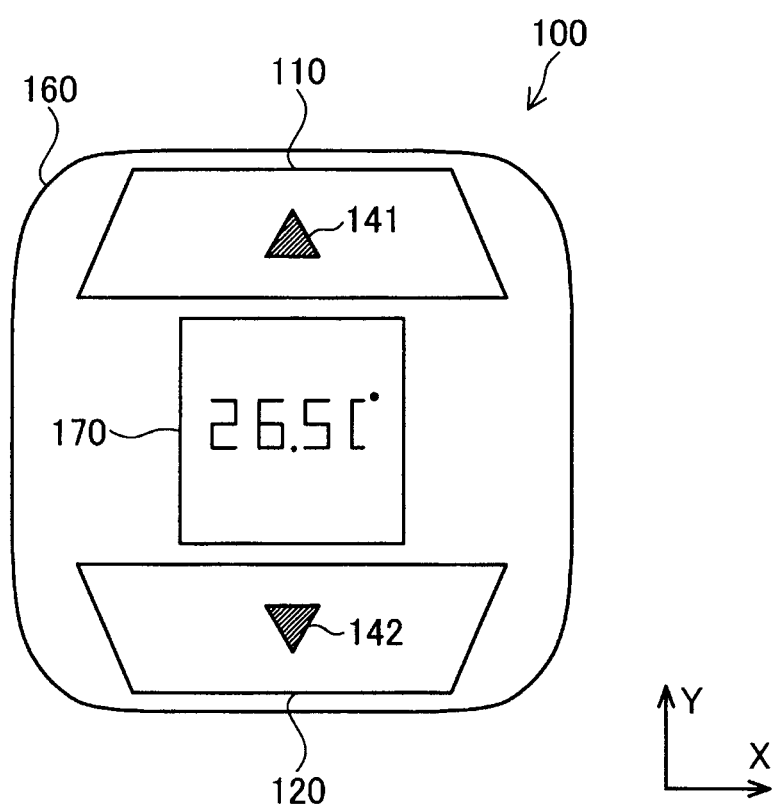
FIG. 2 is a plan view of a touch panel.

FIG. 2 is a plan view of a touch panel 100 in the first embodiment. In FIG. 2, the direction X and the direction Y are perpendicular to each other. The touch panel 100 includes touch electrodes 110 and 120, a substrate 160, and a display 170.

The touch electrodes 110 and 120 are made of a conductor such as copper foil, carbon, conductive rubber and the like, and have a trapezoidal shape in plan view having a long-side direction and a shod-side direction. The "long-side direction" herein refers to a direction parallel to the direction X, whereas the "short-side direction" herein refers to a direction perpendicular to the long-side direction (a direction parallel to the direction Y). Hereinafter, the "direction X" may be referred to as "long-side direction X", and the "direction Y" may be referred to as "short-side direction Y". A pair of touch electrodes 110 and 120 are provided on the substrate 160 vertically symmetrically along the direction Y, and have the same configuration. A touch detection circuit and a threshold determination circuit similar to those shown in FIG. 1 of the touch electrode 110 are connected to the touch electrode 120, and a touch detection signal generated by a touch operation to the touch electrode 120 is input to the same microcomputer 400 (as shown in FIG. 1).

Temperature adjustment marks 141 and 142 indicating increase and decrease of the set temperature of the air conditioner are depicted on the touch electrodes 110 and 120. When adjusting the temperature, the operator can change the set temperature by touching any location on the entire areas of the touch electrodes 110 and 120 including the areas of the temperature adjustment marks 141 and 142. The display 170 is a visual display device such as a liquid crystal display and shows the set temperature.

Figure 3:
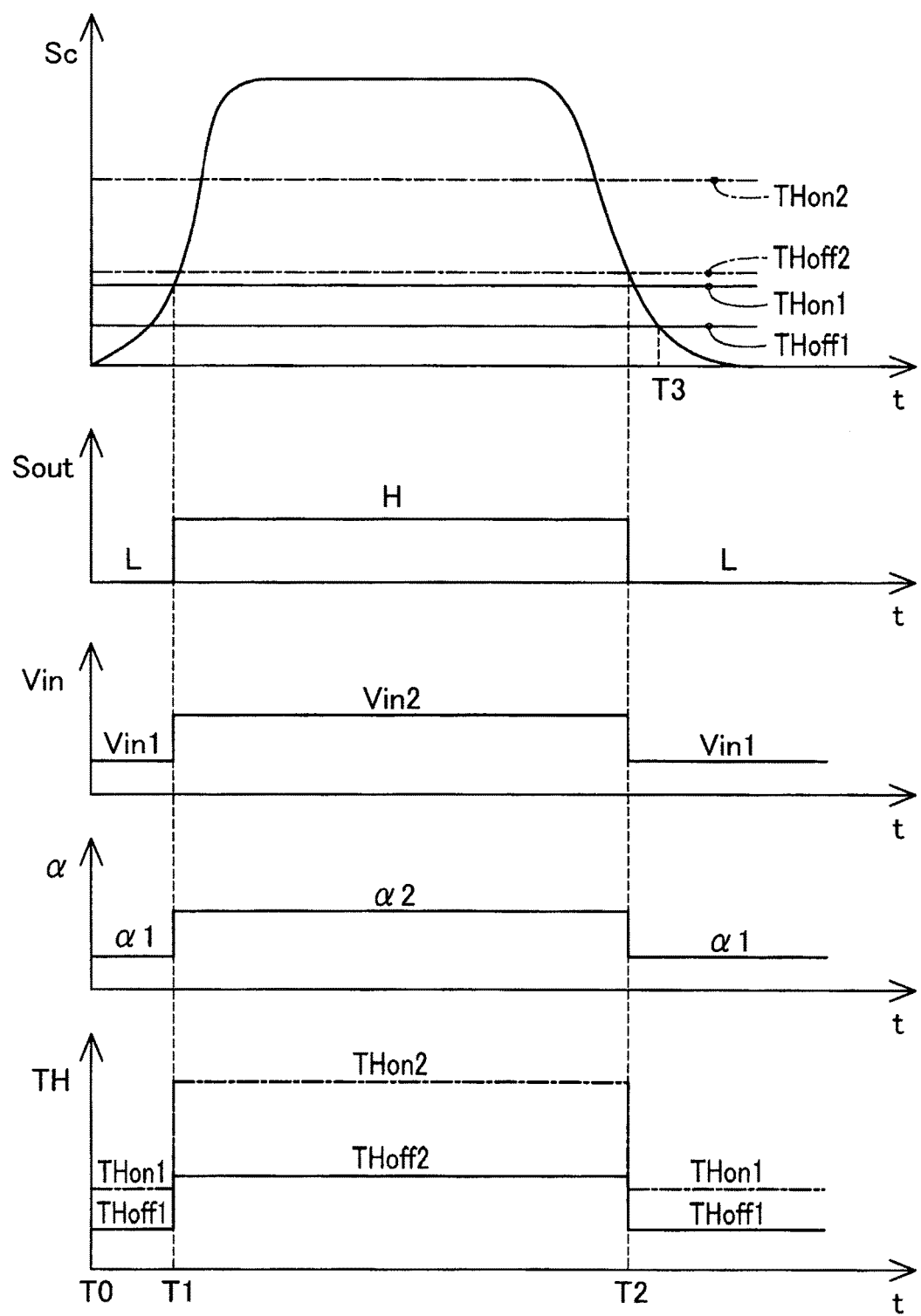
FIG. 3 is a diagram illustrating changes in various signals during a touch operation plotted against time.

FIG. 3 is a diagram illustrating the changes in the capacitance signal Sc, a touch detection signal Sout, a threshold determination signal Vin, a threshold coefficient α, and a threshold TH plotted against time when the operator performs a touch operation to the touch electrode 110 on the touch panel 100 shown in FIG. 2. The threshold TH includes an ON threshold THon and an OFF threshold THoff lower than the ON threshold THon. When the voltage of the capacitance signal Sc rises and exceeds the ON threshold THon, it is determined that there is a touch (may be referred to as a first determination). After that, when the voltage of the capacitance signal Sc reduces and falls below the OFF threshold THoff, it is determined that there is no touch. FIG. 3 depicts a pair of first ON threshold THon1 and first OFF threshold THoff1, and another pair of second ON threshold THon2 and second OFF threshold THoff2, which are higher than the first ON threshold THon1 and first OFF threshold THoff1, respectively.

Between time T0 to time T1, as the operator's finger approaches the touch electrode 110, the capacitance of the touch electrode 110 increases, and the voltage of the capacitance signal Sc rises. At this time, the voltage value of the capacitance signal Sc is lower than the first ON threshold THon1, so that the touch detection signal Sout outputs a first level L indicative of the absence of a touch.

At this time, the FET 34 of the threshold determination circuit 310 shown in FIG. 1 is in an OFF state. Voltage Vin1 of the threshold determination signal Vin input to the threshold set circuit 212 (FIG. 1) of the touch detection circuit 210 can be expressed by Equation 2:

$$Vin1=(R1 \times Vref)/(R1+R2) \qquad \text{Equation 2}$$

where R1 represents a resistance value of the resistor 31 (FIG. 1), R2 represents a resistance value of the resistor 32 (FIG. 1), and Vref represents a reference voltage.

The first ON threshold THon1 and first OFF threshold THoff1 set by the threshold set circuit 212 at this time can be given by, for example, Equation 3 and Equation 4:

$$THon1=THon0 \times \alpha 1 \qquad \text{Equation 3,}$$

$$THoff1=THoff0 \times \alpha 1 \qquad \text{Equation 4}$$

where THon0 and THoff0 respectively represent predetermined fixed ON value and fixed OFF value, and $\alpha 1$ represents a threshold coefficient.

The relationship between the voltage of the threshold determination signal Vin and the threshold coefficient $\alpha$ can be given by, for example, Equation 5:

$$\alpha = k \times Vin + \alpha 0 \qquad \text{Equation 5,}$$

where k and $\alpha 0$ are predetermined constants. $\alpha 0$ may be set to zero.

Immediately after time T1, the voltage value of the capacitance signal Sc exceeds the first ON threshold THon1, so that the touch detection signal Sout changes from the first level L to a second level H indicative of the presence of a touch. The FET 34 shown in FIG. 1 is switched from the OFF state to an ON state in accordance with this change. Voltage Vin2 of the threshold determination signal Vin at this time can be expressed by Equation 6:

$$Vin2=(R1 \times Vref)/\{R1+[(R2 \times R3)/(R2+R3)]\} \qquad \text{Equation 6,}$$

where R3 represents a resistance value of the resistor 33.

As can be seen from Equation 6 and Equation 2, the voltage of the threshold determination signal Vin increases from voltage Vin1 to voltage Vin2 immediately after time T1. Accordingly, from Equation 5, the threshold coefficient $\alpha$ increases from threshold coefficient $\alpha 1$ to threshold coefficient $\alpha 2$. The second ON threshold THon2 and second OFF threshold THoff2 set by the threshold set circuit 212 at this time can be given by Equation 7 and Equation 8:

$$THon2=THon0 \times \alpha 2 \qquad \text{Equation 7,}$$

$$THoff2=THoff0 \times \alpha 2 \qquad \text{Equation 8}$$

As can be seen from Equation 7 and Equation 8, the pair of first ON threshold THon1 and first OFF threshold THoff1 increase to the pair of second ON threshold THon2 and second OFF threshold THoff2 immediately after time T1.

As shown in the changes in these signals described above from time T0 to immediately after time T1, when the touch detection signal Sout changes from the first level L indicative of the absence of a touch to the second level H indicative of the presence of a touch, the voltage of the threshold determination signal Vin is increased accordingly from voltage Vin1 to voltage Vin2 and supplied to the touch detection circuit 210 in order to increase the pair of first ON threshold THon1 and first OFF threshold THoff1 of the touch detection circuit 210 to the other pair of second ON threshold THon2 and second OFF threshold THoff2.

In the example of FIG. 3, the second OFF threshold THoff2 is a higher value than the first ON threshold THon1, so that there may be a case where chattering occurs immediately after time T1. According to the tests conducted by the inventor of the present application, no such chattering occurs when the circuit configuration shown in FIG. 1 is employed, since the switching speed of the FET 34 is not so high. However, it is preferable, to more reliably prevent chattering, to change the threshold such that the second OFF threshold THoff2 is lower than the first ON threshold THon1.

Between time T1 to time T2, as the operator's finger moves away from the touch electrode 110, the capacitance of the touch electrode 110 decreases, and the voltage of the capacitance signal Sc slowly falls down. Immediately after time T2, the voltage value of the capacitance signal Sc falls below the second OFF threshold THoff2, so that the touch detection signal Sout changes from the second level H to the first level L indicative of the absence of a touch. In accordance with this change, the FET 34 shown in FIG. 1 is switched from the ON state to the OFF state, and the voltage of the threshold determination signal Vin changes from voltage Vin2 back to voltage Vin1, while the second ON threshold THon2 and second OFF threshold THoff2 return to the original first ON threshold THon1 and first OFF threshold THoff1.

Assuming that time T2 is elapsed without increasing the first ON threshold THon1 and first OFF threshold THoff1, it is determined that there is a touch until time T3, because the capacitance signal Sc declines slowly as the operator's finger moves away. As a result, the operator experiences an unpleasant feeling that the response of the touch electrode 110 is slow between time T2 and time T3.

As described above, in the first embodiment, when the touch detection signal Sout changes from the first level L indicative of the absence of a touch to the second level H indicative of the presence of a touch, the first ON threshold THon1 and first OFF threshold THoff1 of the touch detection circuit 210 increase accordingly to the other pair of second ON threshold THon2 and second OFF threshold THoff2, so that the response speed of the touch electrode 110 in the transition from a touch state to a non-touch state during a touch operation can be increased.

Instead of setting a pair of ON threshold THon and OFF threshold THoff, one threshold TH may be set. In this case, when the capacitance signal Sc exceeds the threshold TH, it is determined that there is a touch, and when the capacitance signal Sc falls below the threshold TH, it is determined that there is no touch. It is preferable, though, to set a pair of ON threshold THon and OFF threshold THoff, because, by setting a pair of ON threshold THon and OFF threshold THoff, the possibility of chattering during a touch can be reduced.

(Second Embodiment)

Figure 4:
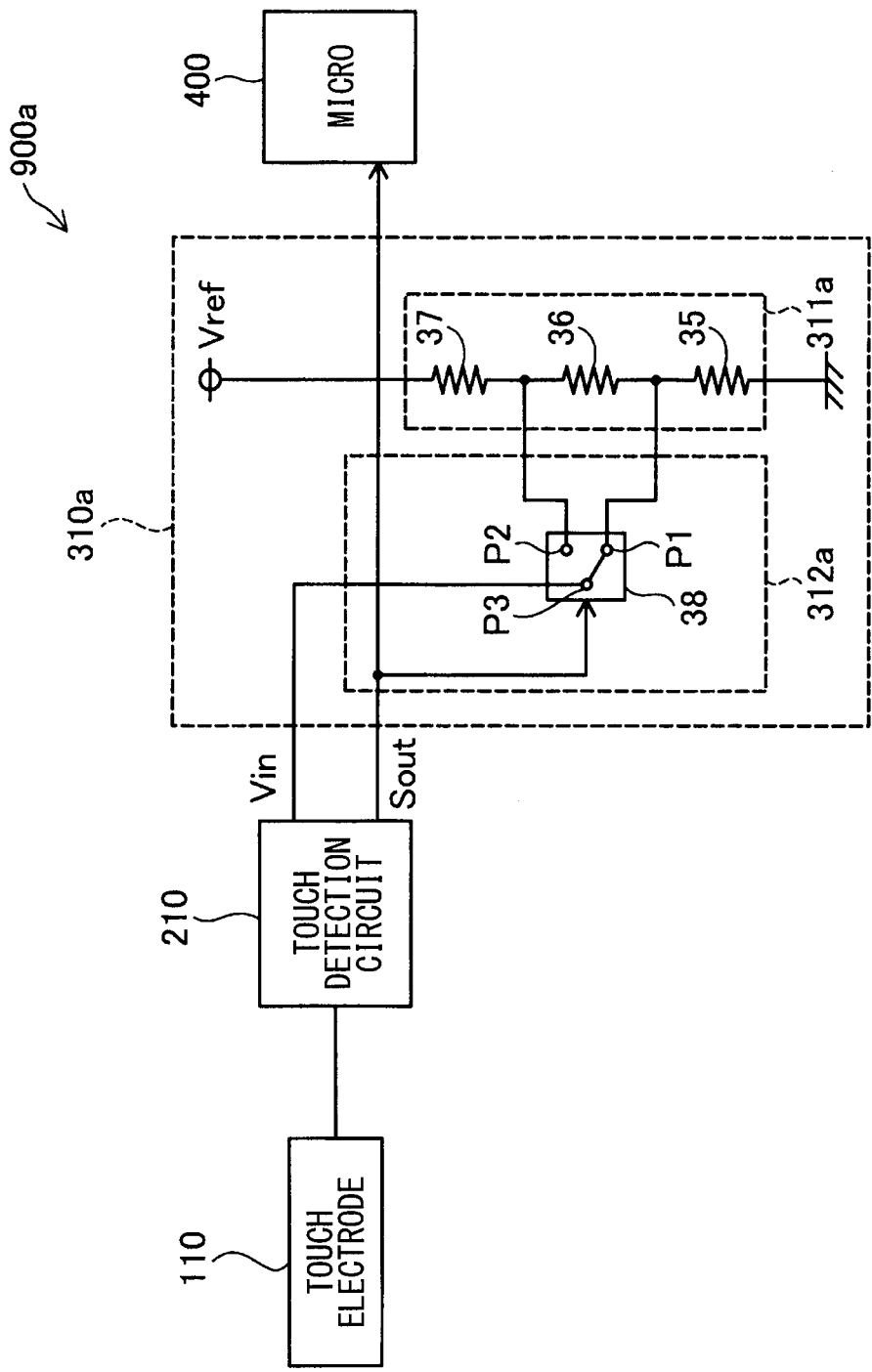
FIG. 4 is a diagram showing a system configuration of a capacitive touch switch apparatus in a second embodiment.

FIG. 4 is an illustrative diagram showing a system configuration of a capacitive touch switch apparatus 900a in a second embodiment. The configuration of a threshold determination circuit 310a may be a difference from the first embodiment shown in FIG. 1, and other features are similar to those of the first embodiment. A touch detection circuit 210 is simplified for convenience of illustration.

The threshold determination circuit 310a includes a voltage divider circuit 311a including resistors 35, 36, and 37, and a switching circuit 312a including a demultiplexer 38 (hereinafter referred to as "selector 38"). The three resistors 35, 36, and 37 are connected in series between a ground electrode having a ground potential and a power supply terminal that outputs a reference voltage Vref. Of three terminals P1, P2, and P3 of the selector 38, the two input terminals P1 and P2, which are the object of switching, are respectively connected to two connection points in the series connection of the three resistors 35, 36, and 37. The output terminal P3 of the selector 38 is connected to the input terminal of the touch detection circuit 210 for inputting the threshold determination signal Vin. A touch detection signal Sout is input to a control input terminal of the selector 38.

The voltage divider circuit 311a divides the reference voltage Vref with the resistors 35, 36, and 37 to generate a threshold determination signal Vin, and inputs the signal to the touch detection circuit 210. The switching circuit 312a changes the division ratio of the voltage divider circuit 311a in accordance with the touch detection signal Sout output from the touch detection circuit 210, to change the voltage of the threshold determination signal Vin. More specifically, when the touch detection signal Sout is at a first level L indicative of the absence of a touch, the selector 38 selects the first input terminal P1. Voltage Vin1a of the threshold determination signal Vin at this time can be given by Equation 9:

$$Vin1a = (R5 \times Vref)/(R5+R6+R7) \qquad \text{Equation 9,}$$

where R5, R6, and R7 respectively represent resistance values of the resistors 35, 36, and 37, and Vref represents a reference voltage.

When the touch detection signal Sout is at the second level H indicative of the presence of a touch, the selector 38 selects the second input terminal P2. Voltage Vin2a of the threshold determination signal Vin at this time can be given by Equation 10:

$$Vin2a = [(R5+R6) \times Vref]/(R5+R6+R7) \qquad \text{Equation 10.}$$

As can be seen from Equation 9 and Equation 10, voltage Vin2a after the touch is higher than voltage Vin1a before the touch. That is, when the touch detection signal Sout changes from the first level L to the second level H, the voltage of the threshold determination signal Vin is increased from voltage Vin1a to voltage Vin 2a. In accordance with this, similarly to the first embodiment, a pair of first ON threshold THon1 and first OFF threshold THoff1 of the touch detection circuit 210 are increased to another pair of second ON threshold THon2 and second OFF threshold THoff2. Thus, similar to the first embodiment, the response speed of the touch electrode 110 in the transition from a touch state to a non-touch state during a touch can be increased.

(Third Embodiment)

Figure 5:
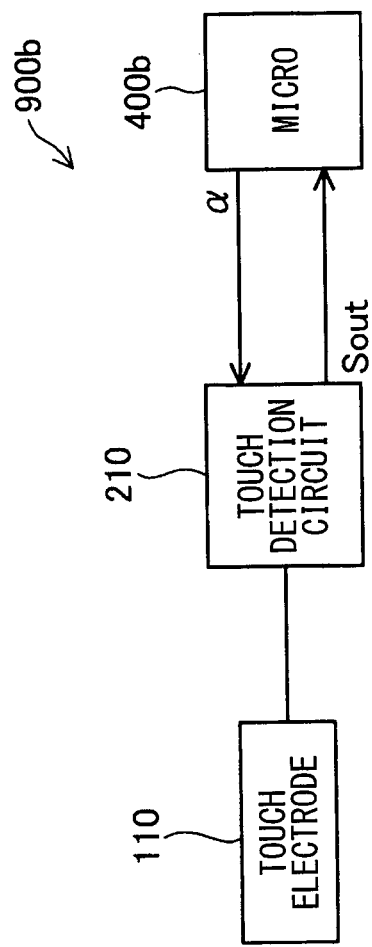
FIG. 5 is a diagram showing a system configuration of a capacitive touch switch apparatus in a third embodiment.

FIG. 5 is an illustrative diagram showing a system configuration of a capacitive touch switch apparatus 900b in a third embodiment. The only difference from the first embodiment shown in FIG. 1 is that a microcomputer 400b functions as a threshold determination circuit, and other features are similar to those of the first embodiment. A touch detection circuit 210 is simplified for convenience of illustration. The microcomputer 400b supplies different threshold coefficients α1 and α2 as a threshold determination signal α to the touch detection circuit 210 in accordance with a touch detection signal Sout output from the touch detection circuit 210.

Figure 6:
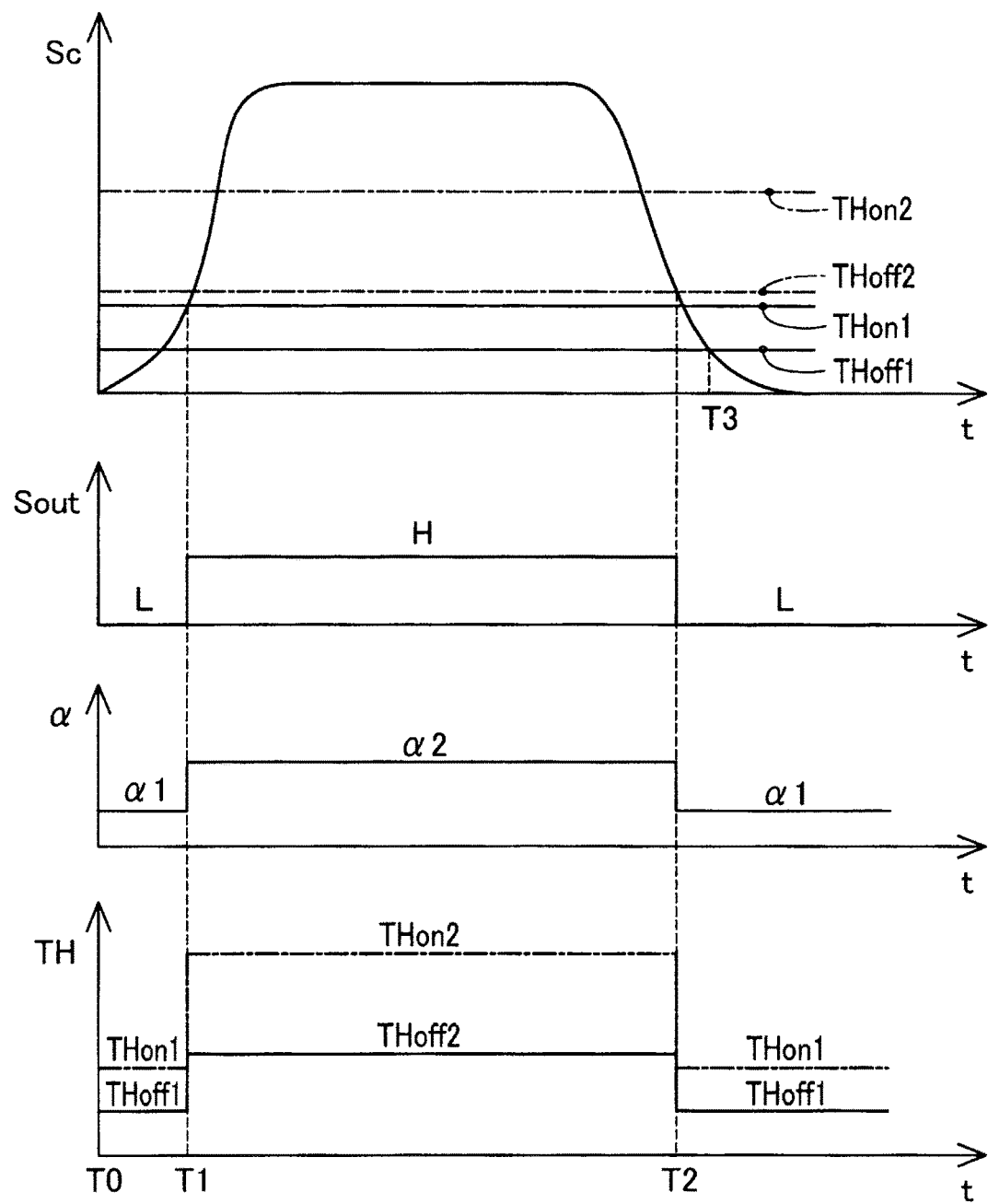
FIG. 6 is a diagram illustrating changes in various signals during a touch operation plotted against time in the third embodiment.

FIG. 6 is a diagram corresponding to FIG. 3 of the first embodiment and illustrating the changes in the capacitance signal Sc, touch detection signal Sout, threshold coefficient a, and threshold TH plotted against time when the operator performs a touch operation to the touch electrode 110 (similar to that of FIG. 2) on the touch panel 100 of the third embodiment. Between time T0 to time T1, a touch detection signal Sout, namely a first level L indicative of the absence of a touch, is input from the touch detection circuit 210 (FIG. 5) to the microcomputer 400b (FIG. 5). At this time, the microcomputer 400b inputs a threshold coefficient α1 as the threshold determination signal α to the touch detection circuit 210. Therefore, the threshold TH is the same as the first ON threshold THon1 and first OFF threshold THoff1 shown by Equation 3 and Equation 4 of the first embodiment.

Immediately after time T1, the touch detection signal Sout changes from the first level L to a second level H indicative of the presence of a touch. In accordance with this change, the microcomputer 400b inputs a threshold coefficient α2 that is larger than the threshold coefficient α1 as the threshold determination signal α to the touch detection circuit 210. As a result, as shown by Equation 7 and Equation 8 of the first embodiment, a pair of first ON threshold THon1 and first OFF threshold THoff1 are increased to another pair of second ON threshold THon2 and second OFF threshold THoff2.

Immediately after time T2, the touch detection signal Sout changes from the second level H to the first level L indicative of the absence of a touch. In accordance with this change, the microcomputer 400b inputs the original threshold coefficient α1 as the threshold determination signal α to the touch detection circuit 210. Thus the second ON threshold THon2 and second OFF threshold THoff2 are returned to the original first ON threshold THon1 and first OFF threshold THoff1.

Also in the third embodiment, when the touch detection signal Sout changes from the first level L indicative of the absence of a touch to the second level H indicative of the presence of a touch, the pair of first ON threshold THon1 and first OFF threshold THoff1 of the touch detection circuit 210 are increased accordingly to the other pair of second ON threshold THon2 and second OFF threshold THoff2, so that the response speed of the touch electrode 110 in the transition from a touch state to a non-touch state during a touch operation can be increased.

(Fourth Embodiment)

Figure 7:
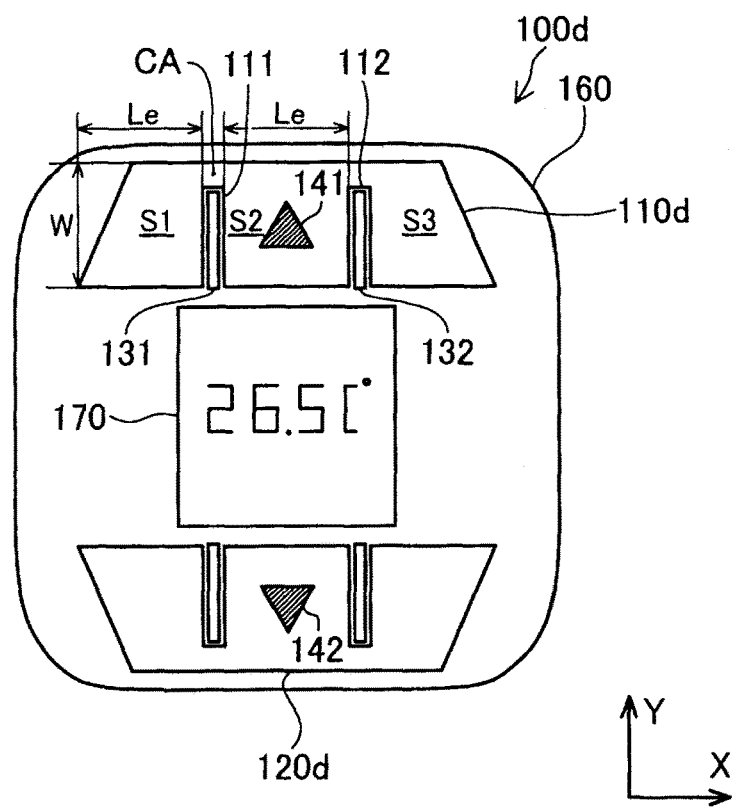
FIG. 7 is a plan view of a touch panel in a fourth embodiment.

FIG. 7 is a plan view of a touch panel 100d in the fourth embodiment and corresponds to FIG. 2. Each of the configurations of touch electrodes 110d and 120d is the only difference from the first embodiment shown in FIG. 2, and other features are similar to those of the first embodiment. The configurations of the second and third embodiments may be adopted for the circuit features other than the touch electrodes 110d and 120d.

The touch electrode 110d is provided with slits 111 and 112 extending parallel to the short-side direction Y at two locations along the long-side direction X. The slits 111 and 112 divide the touch electrode 110d into three small touch areas S1, S2, and S3. The small touch areas S1 and S2 are partly separated by the slit 111 but connected to each other, while the small touch areas S2 and S3 are partly separated by the slit 112 but connected to each other. The boundaries between the small touch areas S1 and S2, and S2 and S3, can be determined by assuming a situation where the small touch areas S1, S2, and S3 are completely separated from each other by extensions of the slits 111 and 112. Therefore, for example, there is a connection area CA having the same width as the slit 111 and not belonging to either of the small touch areas S1 and S2 between the two small touch areas S1 and S2. The touch electrode 120d has the same configuration as the touch electrode 110d.

The small touch area S1 of the touch electrode 110d has a trapezoidal shape, with a ratio Le/W of about 1, where Le is the length along the long-side direction X of the circumscribed rectangle, and W is the width along the short-side direction Y. The small touch area S2 is substantially square, having a length Le along the long-side direction X of the circumscribed rectangle equal to the length Le of the circumscribed rectangle of the small touch area S1, and a width W along the short-side direction Y equal to the width W of the circumscribed rectangle of the small touch area S1. The small touch area S3 has the same shape as the small touch area S1. Thus the small touch areas S1, S2, and S3 all have a ratio Le/W of about 1, Le being the length along the long-side direction X of each circumscribed rectangle, and W being the width along the short-side direction Y. The circumscribed rectangles that determine the sizes of the small touch areas S1, S2, and S3 are defined as smallest rectangles each having four sides that touch the small touch areas S1, S2, and S3 respectively, and having sides parallel to the long-side direction X of the touch electrode 110d and sides parallel to the short-side direction Y.

Guard electrodes 131 and 132 are disposed inside the slits 111 and 112, respectively. The guard electrodes 131 and 132 are insulated from the touch electrode 110d. The guard electrodes 131 and 132 are each preferably connected to a ground pattern (not shown) provided on the substrate 160 or to a ground electrode. This reduces the influence on each other of the small touch areas S1, S2, and S3 caused by electrical changes in the touch electrode 110d when there is a touch. The small touch areas S1, S2, and S3 are thus electrically reliably separated from each other, so that the width along the long-side direction X of the slits 111 and 112 can be made small, and the areas of the small touch areas S1, S2, and S3 can be made large. As a result, the response speed of the touch electrode when the operator's finger contacts the touch electrode 110 can be increased.

The slits 111 and 112 preferably have a size as measured along the short-side direction Y of the touch electrode 110d from 80% or more to less than 100% of the width W in the short-side direction Y of the touch electrode 110d. In other words, the connection area CA preferably has a size as measured along the short-side direction Y of the touch electrode 110d of less than 20% of the width W in the short-side direction Y of the touch electrode 110d. The same applies to the guard electrodes 131 and 132.

Figure 8:
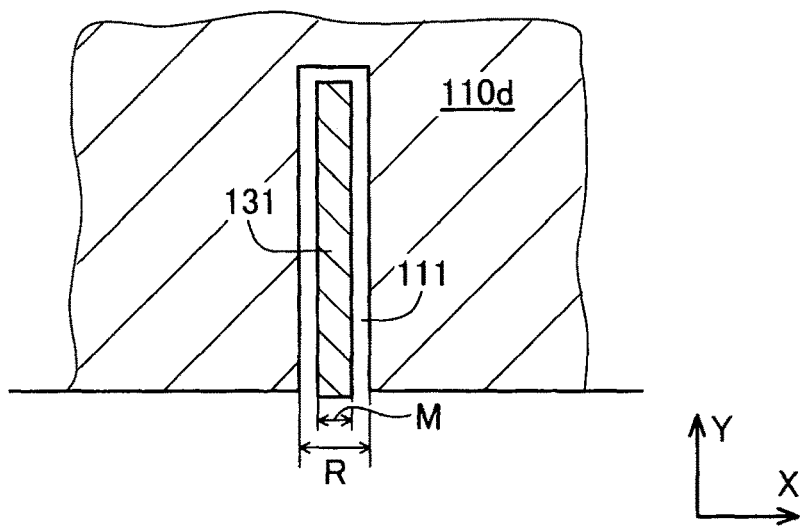
FIG. 8 is a diagram showing a slit of a touch electrode.

FIG. 8 is an enlarged view of the slit 111 of the touch electrode 110d shown in FIG. 7. The slit 111 has a width R along the direction X. The guard electrode 131 has a width M along the direction X. Although not shown in FIG. 8, the slit 112 (FIG. 7) of the touch electrode 110d similarly has a width R along the direction X, and the guard electrode 132 (FIG. 7) similarly has a width M along the direction X.

Figure 9:
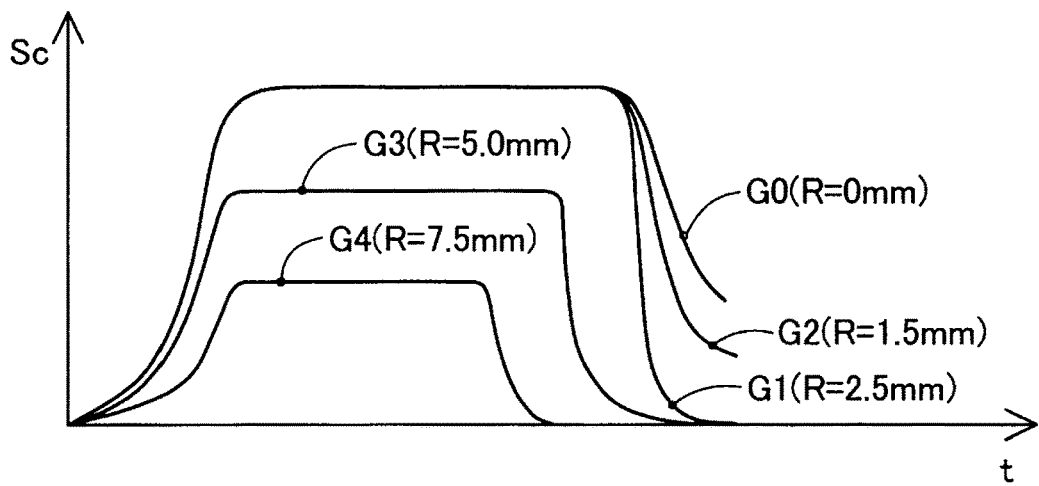
FIG. 9 is a diagram illustrating changes in the capacitance of touch electrodes having slits of different widths plotted against time.

FIG. 9 is a diagram that illustrates changes in the capacitance signal Sc of the touch electrode 110d plotted against time when a touch operation is performed to the touch panel 100d (FIG. 7), with the width R (FIG. 8) of the slits 111 and 112 of the touch electrode 110d being varied in the range from 1.5 mm to 7.5 mm, while the width M (FIG. 8) of the guard electrodes 131 and 132 is maintained constant (1 mm). Graph G0 represents changes in the capacitance signal Sc of the touch electrode 110 plotted against time without slits of the first embodiment shown in FIG. 2. Graph G1 represents changes in the capacitance signal Sc of the touch electrode 110d plotted against time with the slits 111 and 112 having a width R of 2.5 mm of the fourth embodiment shown in FIG. 7. Graphs G2 to G4 represent test examples where the width R of the slits 111 and 112 is different. Graphs G0 to G4 rise when the operator's finger approaches the touch panel 100 (100d), stay horizontal when the finger remains on the touch panel 100 (100d), and fall when the finger moves away from the touch panel 100 (100d).

The drop of the capacitance signal Sc of the touch electrode 110d in graphs G1 to G4 when the finger moves away is more rapid than that of Graph G0 that represents the first embodiment. Therefore, as compared to the touch electrode 110 without slits, the operator who performs a touch operation to the touch electrode 110d provided with the slits 111 and 112 is less likely to experience an unpleasant feeling that the response is slow in the transition from a touch state to a non-touch state. As can be seen from this, when the touch electrode 110d is divided by the slits 111 and 112 and guard electrodes 131 and 132 into the small touch areas S1, S2, and S3, the response speed of the touch electrode 110d in the transition from a touch state to a non-touch state can be even more increased.

When the slits 111 and 112 of the touch electrode 110d have a width R of 2.5 mm (graph G1), the capacitance signal Sc of the touch electrode 110 reduces more rapidly when the finger moves away, as compared to when the width R is other values, so that the operator is even less likely to experience an unpleasant feeling that the response is slow in the transition from a touch state to a non-touch state. When the slits 111 and 112 have a width R of 2.5 mm (graph G1), the amount of change in the capacitance signal Sc of the touch electrode 110 between the non-touch state and the touch state is greater as compared to when the width R is 5.0 mm (graph G3) or 7.5 mm (graph G4). Accordingly, the range of the first ON threshold THon1 and first OFF threshold THoff1 shown in FIG. 3 can be set wider. Therefore, the width R of the slits 111 and 112 of the touch electrode 110 is preferably set to 2.0 mm or more and 3.0 mm or less.

(Fifth Embodiment)

Figure 10:
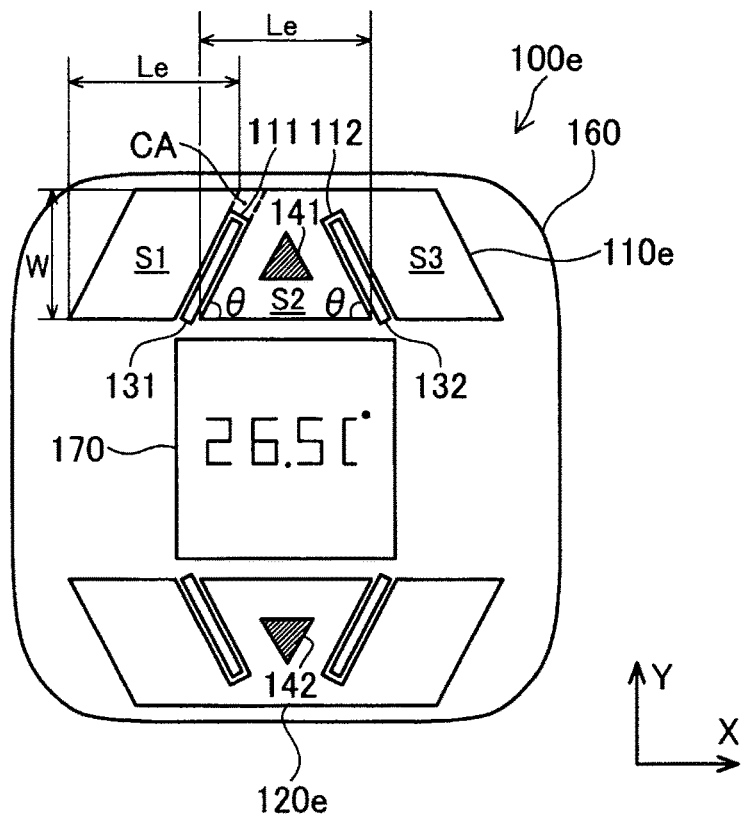
FIG. 10 is a plan view of a touch panel in a fifth embodiment.

FIG. 10 is a plan view of a touch panel 100e in the fifth embodiment and corresponds to FIG. 7. The direction in which slits 111 and 112 of the touch electrode 110e extend is the only difference from the fourth embodiment shown in FIG. 7, and other features are similar to those of the fourth embodiment. The slits 111 and 112 of the touch electrode 110e make an angle θ (45°<θ<90°) with the sides in the long-side direction X. As can be understood from FIG. 7 and FIG. 10, the slits 111 and 112 preferably have a shape that extends in a direction closer to the direction of the short-side direction Y than the direction of the long-side direction X of the touch electrode 110d (110e). Here, "extending in a direction closer to the direction of the short-side direction Y than the direction of the long-side direction X" refers to the angle θ between the slits 111 and 112 and the sides in the long-side direction X satisfying 45°<θ≤90°.

In FIG. 10, the small touch areas S1, S2, and S3 have a ratio Le/W of about 1.3, Le being the length along the long-side direction X of each circumscribed rectangle, and W being the width along the short-side direction Y. As can be understood from FIG. 7 and FIG. 10, the ratio Le/W of the size of each of the small touch areas S1, S2, and S3 are preferably set within the range from 0.7 or more to 1.3 or less. This makes each of the small touch areas S1, S2, and S3 closer to square, so that the possibility of the operator experiencing an unpleasant feeling that the response is slow can be further reduced. The slits 111 and 112 shown in FIG. 10 also preferably have a size as measured along the short-side direction Y of the touch electrode 110e from 80% or more to less than 100% of the width W in the short-side direction Y of the touch electrode 110e.

Thus, according to one embodiment of the present disclosure, a capacitive touch switch apparatus is provided. This capacitive touch switch apparatus includes a touch electrode; a touch detection circuit that generates a capacitance signal indicative of a capacitance of the touch electrode in accordance with a touch operation, and compares the capacitance signal with a threshold, to generate and output a touch detection signal indicative of presence or absence of a touch; and a threshold determination circuit that supplies a threshold determination signal for determining the threshold to the touch detection circuit. The threshold determination circuit supplies the threshold determination signal to the touch detection circuit so as to increase the threshold in accordance with a change of the touch detection signal from a first level indicative of absence of a touch to a second level indicative of presence of a touch.

According to the capacitive touch switch apparatus in this embodiment, the threshold is increased in accordance with a change of the touch detection signal from a first level indicative of the absence of a touch to a second level indicative of the presence of a touch. The response speed of the touch electrode in the transition from a touch state to a non-touch state can thus be increased without changing the response speed of the touch electrode in the transition from the non-touch state to the touch state in a touch operation.

Further, according to the capacitive touch switch apparatus in this embodiment, the threshold determination circuit may include a voltage divider circuit that divides a reference voltage and generates the threshold determination signal, and a switching circuit that changes a voltage of the threshold determination signal by changing a division ratio of the voltage divider circuit in accordance with the touch detection signal. With the capacitive touch Switch apparatus in this embodiment, the threshold can be increased with a relatively simple circuit.

Further, in the capacitive touch switch apparatus in the embodiment described above, the threshold may include an ON threshold and an OFF threshold lower than the ON threshold, and the touch detection circuit may determine that there is a touch when a voltage of the capacitance signal rises and exceeds the ON threshold, and may determine that there is no touch when, after the determination, the voltage of the capacitance signal reduces and falls below the OFF threshold. With the capacitive touch switch apparatus in this embodiment, the ON threshold at which it is determined that there is a touch is different from the OFF threshold at which it is determined that there is no touch, so that the possibility of chattering that may occur in the touch operation can be reduced.

The present disclosure can also be embodied in various forms other than those described above. For example, the present disclosure can be embodied in the form of a production method or the like of a capacitive touch switch apparatus.

While the embodiments, the configurations, the aspects of the capacitive touch switch apparatus have been described by way of example, it should be appreciated that embodiments, configurations, aspects of the present disclosure are not limited to the respective embodiments, the respective configurations, and the respective aspects described above. For example, embodiments, configurations, aspects obtained by appropriately combining technical portions disclosed in different embodiments, configurations, and aspects are included within a range of embodiments, configurations, and aspects of the present disclosure.

What is claimed is:

1. A capacitive touch switch apparatus, comprising:
a touch electrode;
a touch detection circuit that
  generates a capacitance signal indicative of a capacitance of the touch electrode in accordance with a touch operation, and
  generates and outputs a touch detection signal indicative of presence or absence of a touch by comparing the capacitance signal with a threshold; and
a threshold determination circuit that supplies a threshold determination signal for determining the threshold to the touch detection circuit,
wherein:
the threshold determination circuit supplies the threshold determination signal to the touch detection circuit so as to increase the threshold in accordance with a change of the touch detection signal from a first level indicative of absence of the touch to a second level indicative of presence of the touch; and
the threshold determination circuit includes
  a voltage divider circuit that divides a reference voltage to generate the threshold determination signal, and
  a switching circuit that changes a voltage of the threshold determination signal by changing a division ratio of the voltage divider circuit in accordance with the touch detection signal.

2. The capacitive touch switch apparatus according to claim 1, wherein:
the threshold includes an ON threshold and an OFF threshold that is lower than the ON threshold; and
the touch detection circuit determines, as a first determination, that the touch electrode is touched when a voltage of the capacitance signal rises and exceeds the ON threshold, and determines that the touch electrode is not touched when, after the first determination, the voltage of the capacitance signal reduces and falls below the OFF threshold.

3. The capacitive touch switch apparatus according to claim 1, wherein:
the switching circuit of the threshold determination circuit is connected with the touch detection circuit; and
the switching circuit receives the touch detection signal from the touch detection circuit.

4. The capacitive touch switch apparatus according to claim 1, wherein:
the threshold includes an ON threshold and an OFF threshold, which is lower than the ON threshold; and
the threshold determination circuit supplies the threshold determination signal to the touch detection circuit so as to increase the ON threshold in response to a change of the touch detection signal from the first level indicative of absence of the touch to the second level indicative of presence of the touch.

5. The capacitive touch switch apparatus according to claim 1, wherein:
the touch electrode is provided by one of copper foil, carbon, and conductive rubber.

6. The capacitive touch switch apparatus according to claim 1, wherein:
the touch electrode has a rectangular shape.

7. A capacitive touch switch apparatus, comprising:
a touch electrode;
a touch detection circuit that
  generates a capacitance signal indicative of a capacitance of the touch electrode in accordance with a touch operation, and generates and outputs a touch detection signal indicative of presence or absence of a touch by comparing the capacitance signal with a threshold; and a threshold determination circuit that supplies a threshold determination signal for determining the threshold to the touch detection circuit, wherein:

the threshold determination circuit supplies the threshold determination signal to the touch detection circuit so as to increase the threshold in accordance with a change of the touch detection signal from a first level indicative of absence of the touch to a second level indicative of presence of the touch; and the threshold determination circuit includes a voltage divider circuit that divides a reference voltage to generate the threshold determination signal.

8. A capacitive touch switch apparatus, comprising:

a touch electrode;

a touch detection circuit that generates a capacitance signal indicative of a capacitance of the touch electrode in accordance with a touch operation, and generates and outputs a touch detection signal indicative of presence or absence of a touch by comparing the capacitance signal with a threshold; and a threshold determination circuit that supplies a threshold determination signal for determining the threshold to the touch detection circuit, wherein:

the threshold determination circuit supplies the threshold determination signal to the touch detection circuit so as to increase the threshold in accordance with a change of the touch detection signal from a first level indicative of absence of the touch to a second level indicative of presence of the touch; and the threshold determination circuit includes a switching circuit that changes a voltage of the threshold determination signal by changing a division ratio of a voltage divider circuit in accordance with the touch detection signal.

9. A capacitive touch switch apparatus, comprising:

a touch electrode;

a touch detection circuit that generates a capacitance signal indicative of a capacitance of the touch electrode in accordance with a touch operation, and generates and outputs a touch detection signal indicative of presence or absence of a touch by comparing the capacitance signal with a threshold; and a threshold determination circuit that supplies a threshold determination signal for determining the threshold to the touch detection circuit, wherein:

the threshold determination circuit supplies the threshold determination signal to the touch detection circuit so as to increase the threshold in accordance with a change of the touch detection signal from a first level indicative of absence of the touch to a second level indicative of presence of the touch;

the threshold determination circuit includes a voltage divider including a resistor and a switching circuit including a field effect transistor; and the field effect transistor is turned on and off in accordance with the touch detection signal of the touch detection circuit, causing a division ratio of a reference voltage by the voltage divider to change.

\* \* \* \* \*